United States Patent
Takagaki

(10) Patent No.: US 9,046,545 B2
(45) Date of Patent: Jun. 2, 2015

(54) SEMICONDUCTOR DEVICE USING A SILICON WAFER WITH A PATTERN ARRANGEMENT

(75) Inventor: Tatsuro Takagaki, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 837 days.

(21) Appl. No.: 12/963,862

(22) Filed: Dec. 9, 2010

(65) Prior Publication Data

US 2011/0140214 A1 Jun. 16, 2011

(30) Foreign Application Priority Data

Dec. 10, 2009 (JP) ................................ 2009-280128
Nov. 2, 2010 (JP) ................................ 2010-245914
Dec. 6, 2010 (JP) ................................ 2010-271618

(51) Int. Cl.
*H01L 29/06* (2006.01)
*H01L 21/00* (2006.01)
*B65G 47/90* (2006.01)
(Continued)

(52) U.S. Cl.
CPC .......... *G01P 15/0802* (2013.01); *H01L 41/332* (2013.01); *H01L 23/544* (2013.01); *B81B 2201/0235* (2013.01); *B81B 2203/0136* (2013.01); *B81B 2207/053* (2013.01); *B81C 1/00214* (2013.01); *G01P 15/123* (2013.01); *G01P 15/125* (2013.01); *G01P 15/18* (2013.01); *G01P 2015/0814* (2013.01); *G01P 2015/0842* (2013.01)

(58) Field of Classification Search
CPC .................. H01L 21/28123; H01L 2224/116; H01L 23/544; H01L 41/332; B81C 1/00214; G01P 15/123; G01P 15/125; G01P 15/18; G01P 15/0802; B81B 2201/0235; B81B 2203/0136

See application file for complete search history.

(56) References Cited

U.S. PATENT DOCUMENTS 4,595,295 A * 6/1986 Wilczynski .................... 356/401
4,712,016 A * 12/1987 Matsumura .................... 250/548
(Continued)

FOREIGN PATENT DOCUMENTS

JP 08-139339 A 5/1996
JP 2000-171965 A 6/2000
(Continued)

OTHER PUBLICATIONS

Office Action issued in Japanese Patent Application No. 2010-271618 dated Mar. 26, 2014.
(Continued)

*Primary Examiner* — Alonzo Chambliss
(74) *Attorney, Agent, or Firm* — Pearne & Gordon LLP

(57) ABSTRACT

A semiconductor device comprising: a support part; a flexible part, one end of which is supported by the support part; a spindle part supported by the other end of the flexible part; a displacement detection means which detects displacement of the spindle part; and an aperture part arranged adjacent to the spindle part; wherein a plurality of patterns comprised from the aperture part is formed on a silicon wafer parallel to a first direction and a second direction which intersects the first direction, the plurality of patterns include one or more patterns arranged in a straight line in the first direction and the second direction, the plurality of patterns is arranged so that an axis in which a cleavage plane of the silicon wafer and a surface arranged with the pattern on the silicon wafer intersect, and the first direction are different.

8 Claims, 16 Drawing Sheets

(51) Int. Cl.
*G01P 15/08* (2006.01)
*H01L 41/332* (2013.01)
*H01L 23/544* (2006.01)
*B81C 1/00* (2006.01)
*G01P 15/12* (2006.01)
*G01P 15/125* (2006.01)
*G01P 15/18* (2013.01)

(56) References Cited

U.S. PATENT DOCUMENTS

| | | | | |
|---|---|---|---|---|
| 4,969,359 | A | * | 11/1990 | Mikkor ................ 73/514.36 |
| 5,570,405 | A | * | 10/1996 | Chan et al. ................ 378/35 |
| 6,207,966 | B1 | * | 3/2001 | Nguyen et al. ................ 250/548 |
| 6,293,149 | B1 | * | 9/2001 | Yoshida et al. ............ 73/514.01 |
| 6,340,542 | B1 | | 1/2002 | Inoue |
| 6,772,632 | B2 | * | 8/2004 | Okada ................ 73/514.38 |
| 6,953,753 | B2 | | 10/2005 | Oohara et al. |
| 7,010,976 | B2 | * | 3/2006 | Ozawa et al. ............ 73/504.12 |
| 7,107,847 | B2 | * | 9/2006 | Yoshida et al. ............ 73/514.33 |
| 7,322,241 | B2 | * | 1/2008 | Kai ................ 73/514.33 |
| 7,481,113 | B2 | * | 1/2009 | Seto ................ 73/514.33 |
| 7,540,191 | B2 | * | 6/2009 | Hashimoto et al. ........ 73/514.29 |
| 7,629,263 | B2 | * | 12/2009 | Seto ................ 438/736 |
| 7,838,951 | B2 | * | 11/2010 | Kimino ................ 257/414 |
| 8,132,458 | B2 | * | 3/2012 | Maekawa ............ 73/514.33 |
| 8,146,426 | B2 | * | 4/2012 | Sugiura et al. ............ 73/514.32 |
| 8,216,870 | B2 | * | 7/2012 | Morii ............ 438/50 |
| 8,240,205 | B2 | * | 8/2012 | Morii ............ 73/504.12 |
| 8,250,918 | B2 | * | 8/2012 | Morii ............ 73/504.12 |
| 8,329,491 | B2 | * | 12/2012 | Takeshita et al. ............ 438/50 |
| 8,387,458 | B2 | * | 3/2013 | Aida et al. ............ 73/514.33 |
| 2002/0108926 | A1 | | 8/2002 | Witvrouw |
| 2004/0261529 | A1 | * | 12/2004 | Yoshida et al. ............ 73/514.33 |
| 2007/0037310 | A1 | * | 2/2007 | Seto ................ 438/50 |
| 2008/0233487 | A1 | * | 9/2008 | Huang et al. ................ 430/5 |
| 2009/0282918 | A1 | * | 11/2009 | Maekawa ............ 73/514.33 |
| 2010/0005886 | A1 | * | 1/2010 | Aida et al. ............ 73/514.34 |
| 2012/0024065 | A1 | * | 2/2012 | Maekawa ............ 73/514.33 |

FOREIGN PATENT DOCUMENTS

| | | |
|---|---|---|
| JP | 2000-243977 A | 9/2000 |
| JP | 2002-192498 A | 7/2002 |
| JP | 2003-022987 A | 1/2003 |
| JP | 2003-273370 A | 9/2003 |
| JP | 2004-349550 A | 12/2004 |
| JP | 2007-033355 A | 2/2007 |
| JP | 2008-205354 A | 9/2008 |

OTHER PUBLICATIONS

Office Action issued in corresponding Japanese Patent Application No. 2010-271618 dated Nov. 18, 2014.

\* cited by examiner

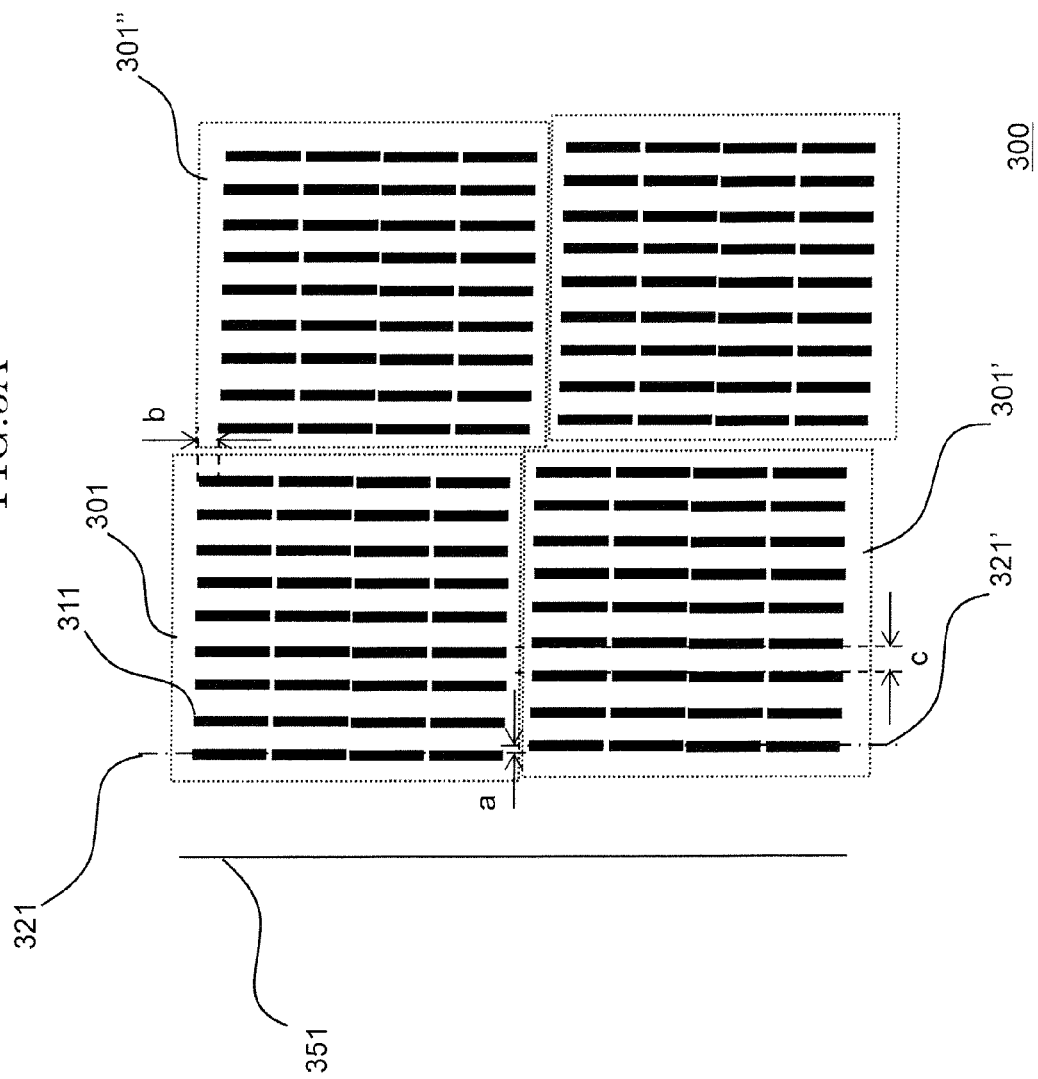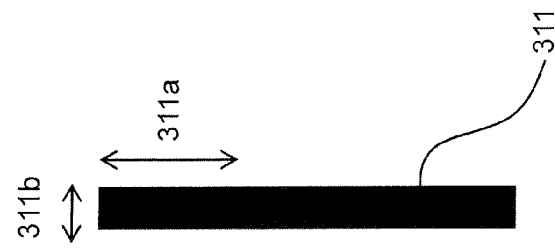

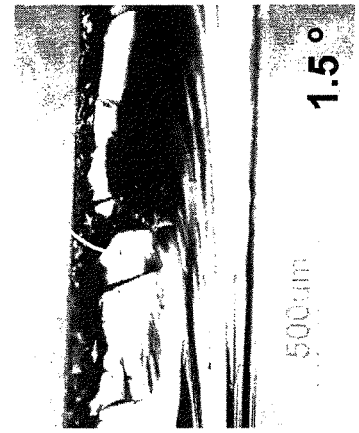
FIG.7A  FIG.7B  FIG.7C
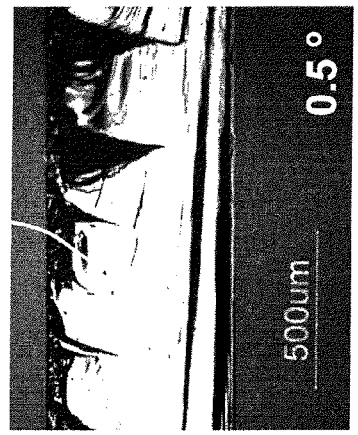
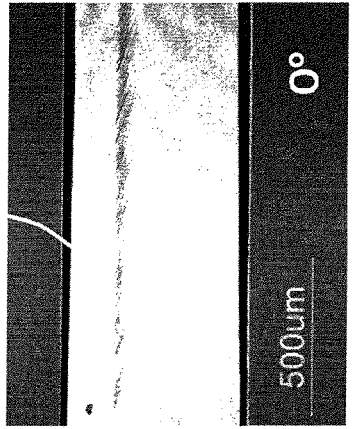
FIG.7D
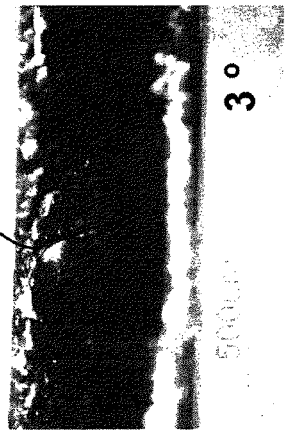
FIG.7E

SEMICONDUCTOR DEVICE USING A SILICON WAFER WITH A PATTERN ARRANGEMENT

CROSS REFERENCE TO RELATED APPLICATIONS

This application is based upon and claims the benefit of priority from the prior Japanese Patent Application No. 2009-280128, filed on Dec. 10, 2009, and Japanese Patent Application No. 2010-245914, filed on Nov. 2, 2010, and Japanese Patent Application No. 2010-271618, filed on Dec. 6, 2010, the entire contents of which are incorporated herein by reference.

FIELD

The present invention is related to semiconductor lithography patterning. In particular, the present invention is related to a pattern arrangement method when forming the same pattern a plurality of times on a silicon wafer. In addition, the present invention is related to a semiconductor device in which the pattern arrangement method is used.

BACKGROUND

In the field of bulk MEMS, deep holes or grooves are formed in a silicon wafer in order to develop functions. Because the silicon wafer which is used at this time is mainly used for supplying semiconductors such as memory or processors etc, a (100) orientated silicon wafer is often used.

In the case of forming deep holes or grooves in a plane direction (100) silicon wafer, it is easy for the wafer to fracture when there are scratches etc due to the properties of the silicon wafer. As an example whereby the easy to fracture properties of the silicon wafer are utilized a technique which makes a silicon wafer easy to fracture by forming a chip separation groove along a cleavage plane is disclosed in Japanese Laid Open Patent H8-139339. However, this ease of fracturing has demerits in terms of handling a pattern formed silicon wafer.

For example, a silicon wafer sometimes fractures even in the case of forming a film using a material with a high level of stress on the silicon wafer. This type of fracture occurs on a cleavage plane in a plane direction <110>.

For example, a technique is disclosed in Japanese Laid Open Patent 2004-349550 in which two silicon wafers are reinforced by mutually misaligning the cleavage planes and joining them together against the properties of a silicon wafer which is easy to fracture along a cleavage plane. However, while combining two silicon wafers secures strength across the entire device, because sufficient strength can not be secured in one silicon wafer, fractures caused by stress in the material which is used in forming a film can not be prevented.

In particular, in the filed of bulk MEMS, the same pattern is often formed a plurality of times having deep holes or grooves along a cleavage plane of a silicon wafer compared to a semiconductor element such as memory. Because the depth of the formed holes or grooves is between a few tens of μm to a few hundred μm, it is easy for fractures to occur along the cleavage plane of the silicon wafer. As a result, when forming the same pattern a plurality of times on a silicon wafer, a pattern arrangement method is preferred in which it is difficult to produce fractures.

SUMMARY

The present invention aims to provide a pattern arrangement method in which it is difficult to produce fractures when forming the same pattern a plurality of times on a silicon wafer, and a silicon wafer which is patterned using semiconductor lithography. The present invention aims to provide a semiconductor device which is produced by using the pattern arrangement method.

According to one embodiment of the present invention, a pattern arrangement method is provided including using a stepper to arrange a plurality of chip patterns arranged parallel to a first direction and a second direction on a silicon wafer using a reticle which includes a plurality of patterns expanded in the first direction and the second direction which intersects the first direction and arranged linearly and intermittently, wherein the stepper adjusts the position of the reticle and the silicon wafer which faces the reticle so that an axis in which a cleavage plane of the silicon wafer and a surface arranged with the pattern on the silicon wafer intersect, and the first direction are different.

Adjusting the position of the reticle and the silicon wafer which faces the reticle by the stepper may be performed by rotating the silicon wafer with respect to a light axis of the stepper.

Adjusting the position of the reticle and the silicon wafer which faces the reticle by the stepper may be performed by rotating the reticle with respect to a light axis of the stepper.

The plurality of chip patterns may be arranged so that an angle between the axis and the first direction becomes a first angle.

The angle between the axis and the first direction of one part of the plurality of chip patterns may be 90 degrees.

The pattern may be an aperture, hole or groove formed on the silicon wafer.

In addition, according to one embodiment of the present invention, a semiconductor device is provided including a support part, a flexible part, one end of which is supported by the support part, a spindle part supported by the other end of the flexible part, a displacement detection means which detects displacement of the spindle part, and an aperture part arranged adjacent to the spindle part, wherein a plurality of patterns comprised from the aperture part is formed on a silicon wafer parallel to a first direction and a second direction which intersects the first direction, the plurality of patterns include one or more patterns arranged in a straight line in the first direction and the second direction, the plurality of patterns is arranged so that an axis in which a cleavage plane of the silicon wafer and a surface arranged with the pattern on the silicon wafer intersect, and the first direction are different.

The displacement detection means may be a stress electrical conversion means which is positioned on the flexible part and detects by converting displacement of the spindle part into an electric signal.

The displacement detection means may include a fixed electrode and a movable electrode, and detects displacement of the spindle part as a capacitance change between the fixed electrode and the movable electrode.

The stress electrical conversion means may be a stress electrical conversion element and the stress electrical conversion element is selected from a piezoresistance element and a piezoelectric element.

The aperture part may be formed by etching the silicon wafer.

The displacement detection means may form a circuit which detects an external force.

The plurality of patterns may be arranged so that an angle between the axis and the first direction becomes a first angle.

The angle between the axis and the first direction of one part of the plurality of patterns may be 90 degrees.

In addition, according to one embodiment of the present invention, a silicon wafer is provided including a plurality of chip patterns, wherein the plurality of chip patterns is arranged parallel to a first direction and a second direction which intersects the first direction, and includes one or more patterns arranged in the first direction and the second direction in a straight line, and the plurality of chip patterns is arranged so that an axis in which a cleavage plane of the silicon wafer and a surface arranged with the pattern on the silicon wafer intersect, and the first direction are different.

One or more patterns arranged in a straight line may include forming the plurality of patterns intermittently within the chip pattern.

The plurality of chip patterns may be arranged so that an angle between the axis and the first direction becomes a first angle.

The angle between the axis and the first direction of one part of the plurality of chip patterns may be 90 degrees.

The pattern may be an aperture, hole or groove formed on the silicon wafer.

BRIEF DESCRIPTION OF THE DRAWINGS

FIG. 5A is a schematic diagram of a silicon wafer 300 arranged with a pattern of the present invention related to one embodiment;

FIG. 5B is a schematic diagram of a pattern 211;

FIG. 7A is an optical micrograph of a silicon wafer cross section in a silicon wafer fracture experiment in an example when the angle θ is 0°;

FIG. 7B is an optical micrograph of a silicon wafer cross section in a silicon wafer fracture experiment in an example when the angle θ is 0.5°;

FIG. 7C is an optical micrograph of a silicon wafer cross section in a silicon wafer fracture experiment in an example when the angle θ is 1.5°;

FIG. 7D is an optical micrograph of a silicon wafer cross section in a silicon wafer fracture experiment in an example when the angle θ is 3 °;

FIG. 7E is an optical micrograph of a silicon wafer cross section in a silicon wafer fracture experiment in an example when the angle θ is 10°;

DESCRIPTION OF EMBODIMENTS

The pattern arrangement method and patterned silicon wafer related to the present invention are explained below while referring to the diagrams. However, various different forms of the pattern arrangement method and patterned silicon wafer of the present invention are possible and should not be interpreted as being limited to the details described in the embodiments and examples shown below. Furthermore, in the diagrams which are referred to in the embodiments and examples of the present invention the same parts or parts which have similar functions have the same reference symbols and repeated explanations are omitted.

(First Embodiment)

Figure 8B:
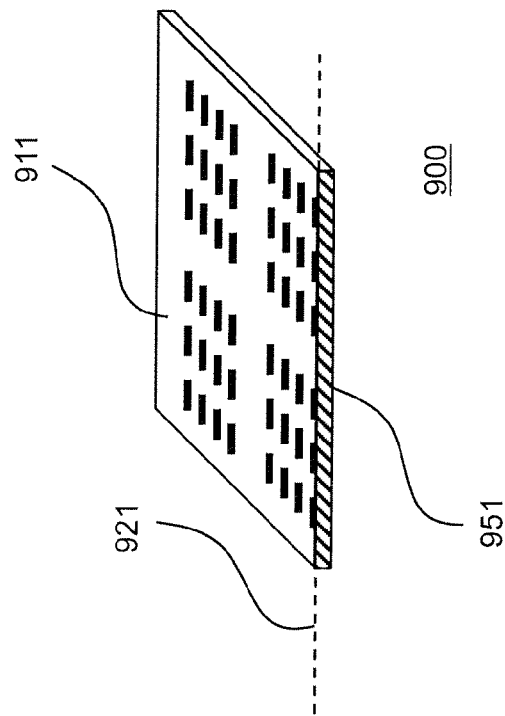
FIG. 8B is the pattern arrangement on the silicon wafer seen from a different angle.
Figure 8A:
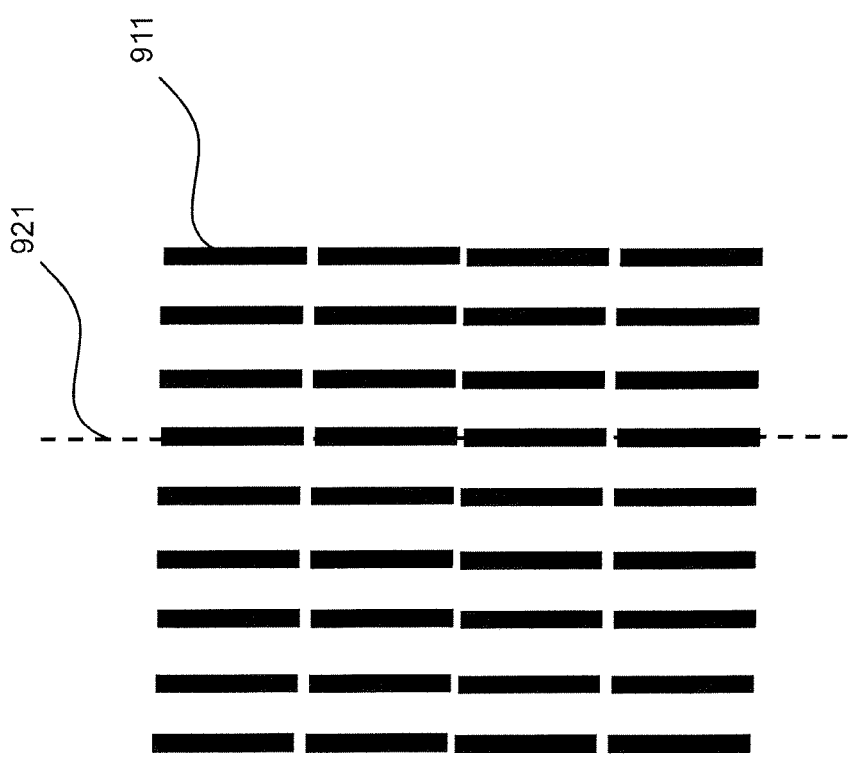
FIG. 8A is a schematic diagram of a silicon wafer 900 arranged with a conventional pattern.

FIG. 8A is a schematic diagram which shows a conventional pattern arrangement formed on a silicon wafer with semiconductor lithography and FIG. 8B is a schematic diagram which shows the conventional pattern arrangement formed on the silicon wafer with semiconductor lithography seen from a different angle. In semiconductor lithography, generally a pattern is arranged by aligning the plane direction in order to obtain the desired electrical properties. For example, in the case where a straight line pattern 911 is arranged consecutively as is shown in FIG. 8 on a (100) orientated silicon wafer 900, when an imaginary line 921 which joins the pattern 911 arranged intermittently in a straight line matches a plane direction <110 >plane direction cleavage plane 951, fractures easily occur along the pattern.

In the case of forming semiconductor elements, a pattern arrangement is performed by aligning the plane direction of a silicon wafer by semiconductor lithography due to the demand for electrical properties. However, in bulk MEMS, because a structure processed by forming a pattern on a silicon wafer is used as a part such as a sensor or machine part in which the mechanical properties of a component are demanded, the demand for electrical properties is low and it is not always necessary to align the plane direction. Thus, the inventors attempted to misalign the plane direction of a silicon wafer which is not usually performed in a pattern arrangement by semiconductor lithography.

Figure 1B:
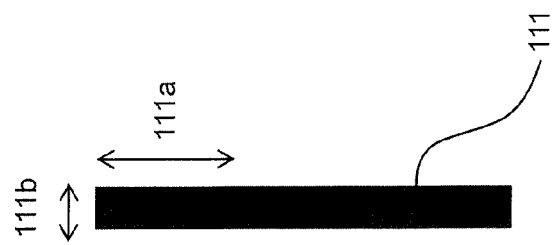
FIG. 1B is a schematic diagram of a pattern 111.
Figure 1A:
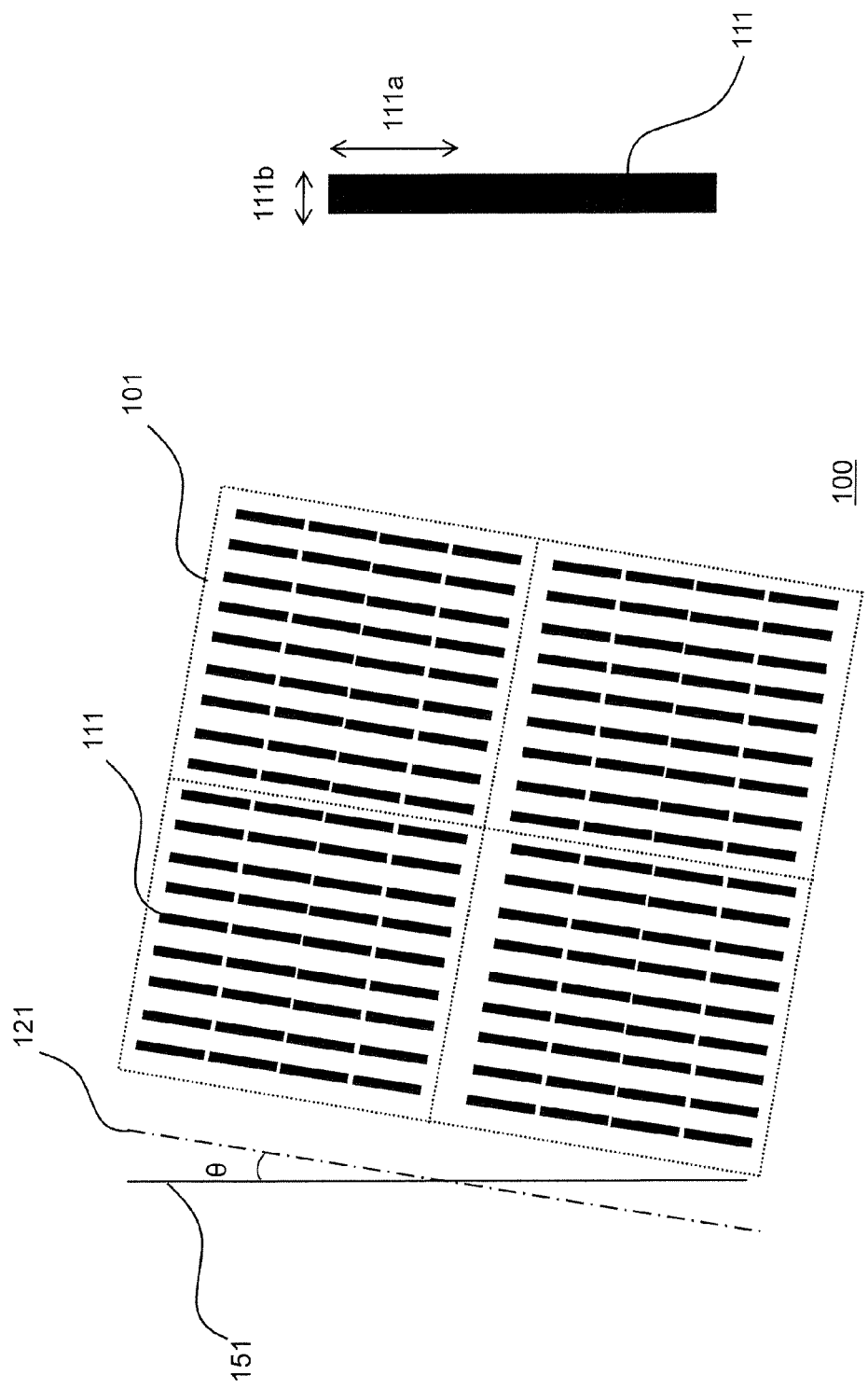
FIG. 1A is a schematic diagram of a silicon wafer 100 arranged with a pattern of the present invention related to one embodiment.

FIG. 1A is a schematic diagram of a silicon wafer 100 arranged with a pattern related to the present invention of the first embodiment. The silicon wafer 100 has a chip pattern 101 which is arranged repeatedly in a first direction 111a and a second direction 111b including a pattern in which a pattern 111 etched to a certain depth in the first direction 111a and second direction 111b is arranged linearly and intermittently. This type of repeating arrangement includes the case where one pattern is formed by forming a plurality of patterns 111 consecutively without any joins in one chip pattern 101. In other words, a plurality of chip patterns in which one or more straight line patterns which face the first direction 111a are arranged in the second direction 111b in the chip pattern 101 can be arranged intermittently in the first direction 111a and the second direction 111b.

Here the chip pattern 101 within which the pattern 111 is arranged exemplifies one chip which forms a MEMS device. An aperture, a hole, a groove, a comb part having a comb structure, a plurality of channels arranged in one direction or a beam part of a sensing device are examples of the pattern 111. In addition, the silicon wafer 100 may be a bare silicon wafer or SOI (Silicon on Insulator) substrate.

At this time, the line 121 which virtually links the pattern 111 which is arranged intermittently as a straight line matches the first direction 111a. A pattern is arranged by misaligning an axis 151 in which the cleavage plane of the silicon wafer and a surface arranged with a pattern on the silicon wafer intersect, and the first direction 111a. When the angle between the axis 151 and the first direction 111a is $\theta$, it is preferred that the angle $\theta$ is 3° or more and 87° or less. As a result of the inventors keen examination, they discovered that by misaligning $\theta$ by 3° or more the silicon wafer becomes more difficult to fracture as described in the examples below. In addition, because it is possible to rotate the angle $\theta$ clockwise or anticlockwise with respect to the cleavage plane 151, it is clear that it is possible to rotate within the range of 93° and 177°, 183° and 267° and 273° and 357°.

A small misalignment in a silicon wafer of less than 3° also sometimes occurs in a general pattern arrangement process. However, this type of small misalignment is not sufficient in order to realize a silicon wafer in which it is difficult for fractures to occur as shown in the examples described below and in the pattern arrangement method and patterned silicon wafer related to the present invention of the first embodiment.

In this way, in order to misalign line 121 and the axis 151 by an angle $\theta$, for example, the silicon wafer may be misaligned by the angle $\theta$ in the stepper.

Figure 2:
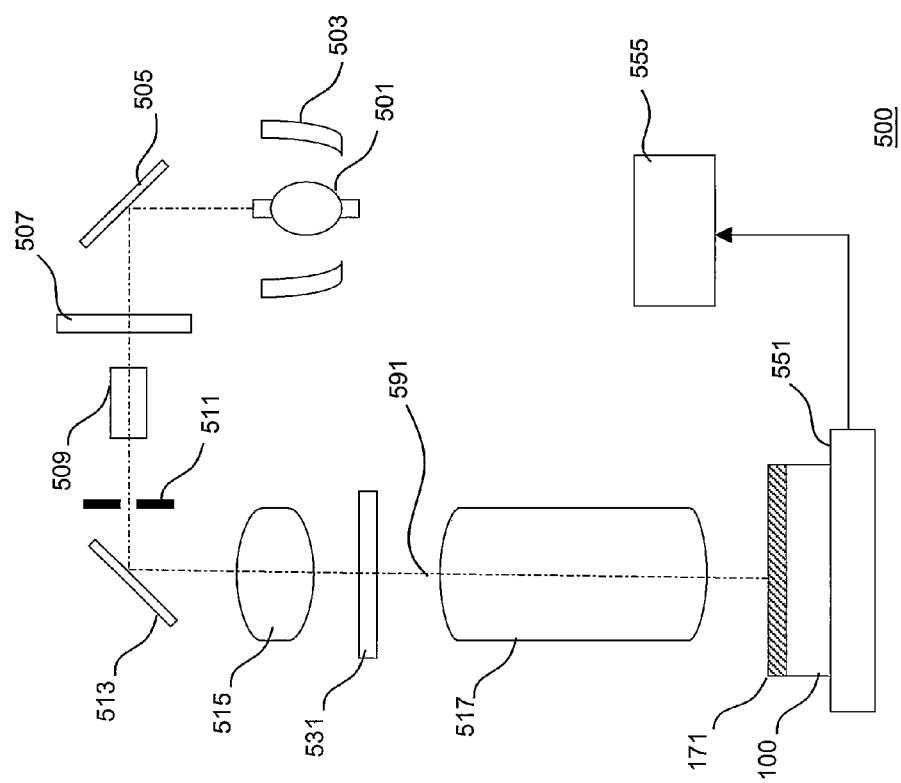
FIG. 2 is a schematic diagram of a stepper 500 of the present invention related to one embodiment.

FIG. 2 is a schematic diagram of a stepper 500 related to the present invention of the first embodiment. The stepper 500 includes, for example, a light source 501, an elliptic mirror 503, a reflective mirror 505, a wavelength selection filter 507, fly eye integrator 509, a blind 511, a reflective mirror 513, a lens system 515, a projection optics system 517, a reticle 531, a stage 551 and a drive control system 555.

Light emitted from the light source 501 is guided to the wavelength selection filter 507 by the elliptic mirror 503 and the reflective mirror 505, is adjusted to a desired wavelength by the wavelength selection filter 507 and made uniform by the fly eye integrator 509. The unified light is irradiated to the reticle 531 by opening and closing the blind 511. In the case where a pattern is exposed to a resist 171, the light is guided to the reticle 531 via the reflective mirror 513 and lens system 515 and the light which is not blocked by the reticle 531 is irradiated on the resist 171 above the silicon wafer 100 via the projection optics system 517. A resist pattern is formed by this projection exposure.

At this time, the drive control system 555 rotates the stage 551 with respect to the light axis (light path) 591 and the angle $\theta$ between the line 121 and the cleavage plane 151 is controlled. Because the silicon wafer 100 generally includes an orientation flat or notch which is a cut out part for showing the plane direction, the drive control system 555 can control the angle $\theta$ by confirming the plane direction based on these.

In addition, the plane direction of the silicon wafer 100 is confirmed by measuring the X ray diffraction of the silicon wafer 100 up to before performing pattern arrangement on the silicon wafer 100, and the plane direction of the silicon wafer 100 may be confirmed by the drive control system 555 by attaching an alignment mark to the silicon wafer 100.

As explained above, with the pattern arrangement method related to the present invention of the first embodiment, in a pattern formation process, by confirming the plane direction of a silicon wafer and attempting to misalign the angle of a pattern to be arranged, excellent effects can be demonstrated by providing a patterned silicon wafer which is difficult to fracture. In addition, the pattern arrangement method related to the present invention of the present embodiment can provide a patterned silicon wafer which is difficult to fracture even if a relatively cheap (100) orientated silicon wafer is used. This type of silicon wafer is easier to handle in the post manufacturing process than conventional silicon wafers. The physical properties of this type of patterned silicon wafer are particularly useful in the field of bulk MEMS.

(Second Embodiment)

In order to realize the pattern arrangement method explained in the first embodiment a stepper 600 having a mechanism for rotating the reticle is explained instead of the stepper 500 in the present embodiment.

Figure 3:
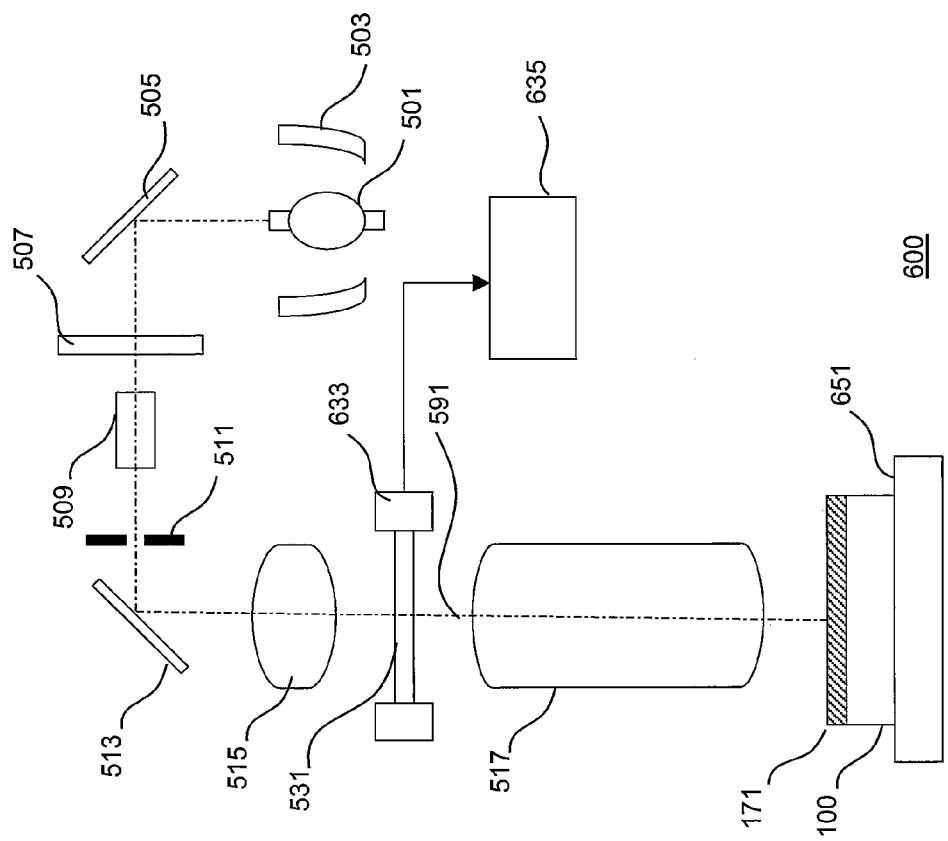
FIG. 3 is a schematic diagram of a stepper 600 of the present invention related to one embodiment.

FIG. 3 is a schematic diagram of a stepper 600 related to the present invention of the second embodiment. The stepper 600, similar to the stepper 500 stated above, includes, for example, a light source 501, an elliptic mirror 503, a reflective mirror 505, a wavelength selection filter 507, fly eye integrator 509, a blind 511, a reflective mirror 513, a lens system 515, a projection optics system 517, a reticle 531 and a stage 551.

The stepper 600 further includes a reticle holder 633 for rotating the reticle 531 and a drive control system 635 for controlling an angle and fixed stage 651.

Light emitted from the light source 501 is guided to the wavelength selection filter 507 by the elliptic mirror 503 and the reflective mirror 505, is adjusted to a desired wavelength by the wavelength selection filter 507 and made uniform by the fly eye integrator 509. The unified light is irradiated to a resist 171 by opening and closing the blind 511. In the case of irradiating to the resist 171, the light is guided to the reticle 531 via the reflective mirror 513 and lens system 515 and the light which is not blocked by the reticle 531 is irradiated on the resist 171 above the silicon wafer 100 via the projection optics system 517.

At this time, the drive control system 635 rotates the reticle holder 633 with respect to the light axis (light path) 591 and the angle $\theta$ between the line 121 and the cleavage plane 151 is controlled. Because the silicon wafer 100 generally includes an orientation flat or notch which is a cut out part for showing the plane direction, the drive control system 635 can control the angle θ by confirming the plane direction based on these.

In addition, as explained in the first embodiment, the plane direction of the silicon wafer 100 is confirmed by measuring the X ray diffraction of the silicon wafer 100 up to before performing a pattern arrangement (aperture, hole, groove, a comb part having a comb structure, a plurality of channels arranged in one direction or a beam part of a sensing device etc.) on the silicon wafer 100, and the plane direction of the silicon wafer 100 may be confirmed by the drive control system 635 by attaching an alignment mark to the silicon wafer 100.

In the method of rotating a reticle holder with respect to a light axis by the drive control system as in the present embodiment a usual stepper can not increase the angle θ. In such a stepper, arrangement is performed at a relatively small angle. In addition, a method for rotating the stepper or reticle is explained in the first and second embodiments, however, it is clear that control is possible in a method which rotates both the stepper and reticle by the driver control system.

As explained above, with the pattern arrangement method related to the present invention of the present embodiment, in a pattern formation process, by confirming the plane direction of a silicon wafer and attempting to misalign the angle of a pattern to be arranged, excellent effects can be demonstrated by providing a patterned silicon wafer which is difficult to fracture. In addition, the pattern arrangement method related to the present invention of the present embodiment can provide a patterned silicon wafer which is difficult to fracture even if a relatively cheap (100) orientated silicon wafer is used. This type of silicon wafer is easier to handle in the post manufacturing process than conventional silicon wafers. The physical properties of this type of patterned silicon wafer are particularly useful in the field of bulk MEMS.

(Third Embodiment)

In the first embodiment an arrangement method in which misalignment was performed so that the line 121 which virtually links the pattern 111 which is arranged intermittently as a straight line does not match the first direction 111a. However, in the present embodiment, an arrangement method is explained in which the facing direction of chip patterns is mutually changed.

Figure 4B:
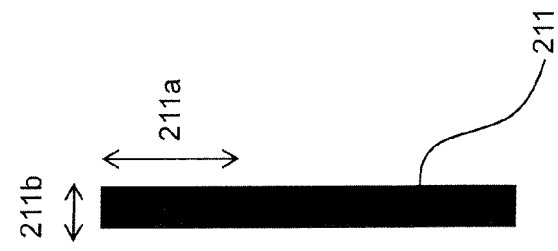
FIG. 4B is a schematic diagram of a pattern 211.
Figure 4A:
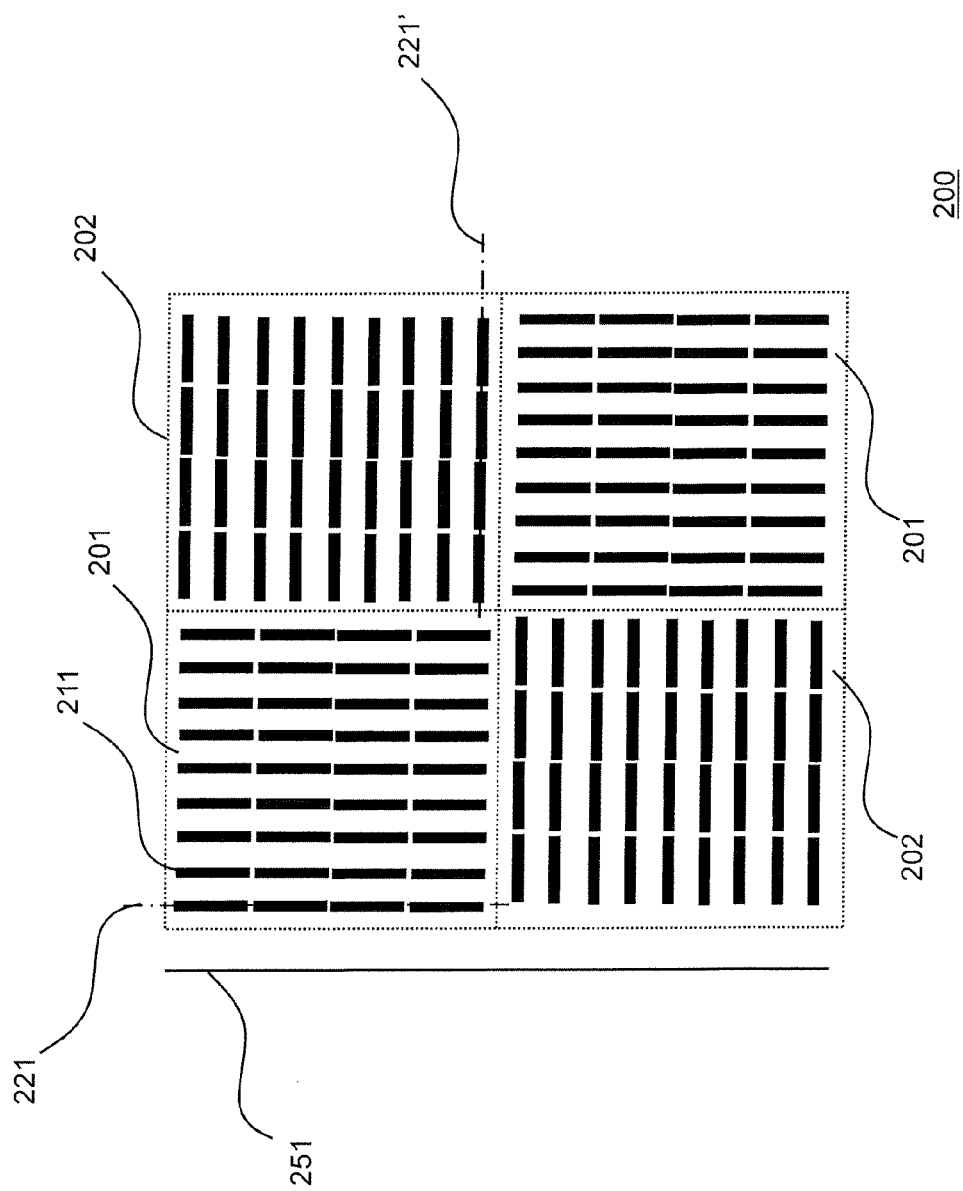
FIG. 4A is a schematic diagram of a silicon wafer 200 arranged with a pattern of the present invention related to one embodiment.

FIG. 4A is a schematic diagram of a silicon wafer 200 arranged with a pattern related to the present invention of the third embodiment. The silicon wafer 200, for example, is repeatedly arranged with a chip pattern 201 which includes a pattern in which a pattern (aperture, hole, groove, a comb part having a comb structure, a plurality of channels arranged in one direction or a beam part of a sensing device etc.) etched to a certain depth in the first direction 211a and the second direction 211b is arranged linearly and intermittently, and a chip pattern 202 in which the chip pattern 201 is rotated 90° on a plane surface of the silicon wafer 200, in the first direction 211a and the second direction 211b.

At this time, the line 221 which virtually links the pattern 211 which is arranged intermittently as a straight line in the pattern 201 matches the first direction 211a. In addition, the line 221' which virtually links the pattern 211 which is arranged intermittently as a straight line in the pattern 202 does not match the first direction 211a but is formed at a 90° angle. In the present embodiment, as is shown in FIG. 4 the chip pattern 202 which is adjacent to the chip pattern 201 is the chip pattern 201 rotated 90°. Because the lines 221 and 221' mutually intersect in this checkered arrangement, the virtual line 221 which matches the axis 251 and is linked across the entire silicon wafer 200 does not occur. Therefore, it is difficult for fractures to occur in the silicon wafer.

The pattern arrangement method related to the present invention of the present embodiment can be realized by the stepper explained in the first and second embodiments. In other words, the drive control system rotates the reticle and/or the stage with respect to the light axis and a pattern may be formed while rotating the chip pattern in sequence. In the pattern arrangement method related to the present invention of the present embodiment, a method for moving the stepper explained in the first embodiment due to the restriction of the movable range of the general stepper reticle explained in the second embodiment is preferred.

As an alternative pattern arrangement method related to the present invention of the present embodiment, room for a region for forming the pattern 202 can be made on the silicon wafer 200, the pattern 201 can be formed in a checkered shape, the silicon wafer can be rotated 90° and the pattern 202 can be formed in the region. In this case, because the silicon wafer 200 is rotated only once, operation efficiency is improved.

In addition, by arranging a plurality of checkered chip patterns as described above on one reticle, it is possible to form them together while the reticle and stage are fixed using an aligner type stepper.

As explained above, with the pattern arrangement method related to the present invention of the present embodiment, by confirming a plane direction of a silicon wafer and arranging a chip pattern in a checkered shape in a pattern formation process, it is possible to demonstrate the excellent effects of providing a patterned silicon wafer which is difficult to fracture. In addition, the pattern arrangement method related to the present invention of the present embodiment can provide a patterned silicon wafer which is difficult to fracture even if a relatively cheap (100) orientated silicon wafer is used. This type of silicon wafer is easier to handle in the post manufacturing process than conventional silicon wafers. The physical properties of this type of patterned silicon wafer are particularly useful in the field of bulk MEMS.

(Fourth Embodiment)

In the fourth embodiment an arrangement method is explained in which the line which virtually links the patterns arranged intermittently as a straight line does not match a cleavage plane by slightly misaligning adjacent chip patterns in an X axis direction and a Y axis direction on a horizontal surface of the silicon wafer.

FIG. 5A is a schematic diagram of a silicon wafer 300 arranged with a pattern related to the present invention of the fourth embodiment. The silicon wafer 300 is repeatedly arranged in a first direction 311a and a second direction 311b with a chip pattern which includes a pattern (aperture, hole, groove, a comb part having a comb structure, a plurality of channels arranged in one direction or a beam part of a sensing device etc.) in which a pattern 311 etched to a certain depth in the first direction 311a and the second direction 311b is arranged linearly and intermittently.

At this time, the line 321 which virtually links the pattern 311 arranged intermittently in the chip pattern 301 as a straight line and the line 321' which virtually links the pattern 311 arranged intermittently in the chip pattern 301' in which the chip pattern 301 is misaligned parallel to the first direction 311a and by a distance a in the second direction 311b, are misaligned so that they do not match.

In addition, as is shown in FIG. 5, the chip pattern 301" may be arranged by misaligning the chip pattern 301 in the second direction 311b and misaligning by a distance b in the first direction 311a. Here, the distance a may be a distance smaller than an interval c of a pair of patterns 311 adjacent in the second direction 311b. In addition, the distance b is a distance smaller than the length of the pattern 311 in the first direction 311a.

In other words, in the present embodiment, the line 321 of the chip pattern 301 and the line 321' of the chip pattern 301' are misaligned by the distance a in the second direction. By misaligning the chip pattern 301 in this way, because the line 321 and the line 321' of an adjacent chip pattern no longer match, a virtual line which has a high level of continuity across the entire silicon wafer 300 does not appear. In this type of arrangement of the chip pattern 301 and 301', it is difficult for the silicon wafer to fracture due to the lines 321 and 321' matching.

Furthermore, even in the case where an axis 351 in which the cleavage plane of the silicon wafer and the surface arranged with a pattern on the silicon wafer intersect and the first direction 311a match, because the line 321 of the chip pattern 301 and the line 321' of the chip pattern 301' are arranged by misaligning by the distance a in the second direction, it is possible to make the silicon wafer difficult to fracture.

The pattern arrangement method related to the present invention of the present embodiment can be realized by the stepper explained in the first and second embodiments. That is, the drive control system moves the reticle and/or stage with respect to the light axis in the first direction 311a and the second direction 311b with respect to the plane surface of the silicon wafer 300, and the chip pattern may be arranged by misaligning in sequence in the first direction 311a and the second direction 311b. In the pattern arrangement method related to the present invention of the present embodiment, a method for moving the stage explained in the first embodiment due to the restriction of the movable range of the general stepper reticle explained in the second embodiment is preferred.

In addition, by arranging a plurality of chip patterns in which each are misaligned in sequence in the first direction 311a and the second direction 311b on one reticle as described above, it is possible to form them at the same time while the reticle and stage are fixed using an aligner type stepper.

As explained above, according to the pattern arrangement method related to the present invention of the present embodiment, in a pattern forming process, by confirming the plane direction of a silicon wafer and attempting to misalign chip patterns in an X axis direction and a Y axis direction in sequence, excellent effects can be demonstrated by providing a patterned silicon wafer which is difficult to fracture. In addition, the pattern arrangement method related to the present invention of the present embodiment can provide a patterned silicon wafer which is difficult to fracture even if a relatively cheap (100) orientated silicon wafer is used. This type of silicon wafer is easier to handle in the post manufacturing process than conventional silicon wafers. The physical properties of this type of patterned silicon wafer are particularly useful in the field of bulk MEMS.

(Fifth Embodiment)

In the present embodiment, an example of the pattern arrangement method related to the present invention described above applied to a silicon wafer of a semiconductor device is explained. In particular, an acceleration sensor is explained as an example of a semiconductor device in the present embodiment. Furthermore, the semiconductor device which can be applied with the pattern arrangement method related to the present invention is not limited to an acceleration sensor. In addition, three main types of acceleration sensor are known, piezo resistor, a piezo element and a capacitance type, due to the difference in the displacement detection means used to detect displacement of a spindle part. As a displacement detection means, there is a piezo resistor type which detects external force as a resistance value change of a piezo resistor arranged on a flexible part, a piezo element type which detects external force as a polarization change which occurs in a piezo element arranged on a flexible part, as an acceleration sensor which includes a stress electrical conversion means which includes a stress conversion element which converts stress placed on a flexible part into an electric signal, and a capacitance type which detects external force as a capacitance change between a fixed electrode and a movable electrode which are a displacement detection means. The pattern arrangement method related to the present invention can be applied to any type of acceleration sensor.

(Manufacturing Method of a Tri-Axial Semiconductor Acceleration Sensor)

Figure 9:
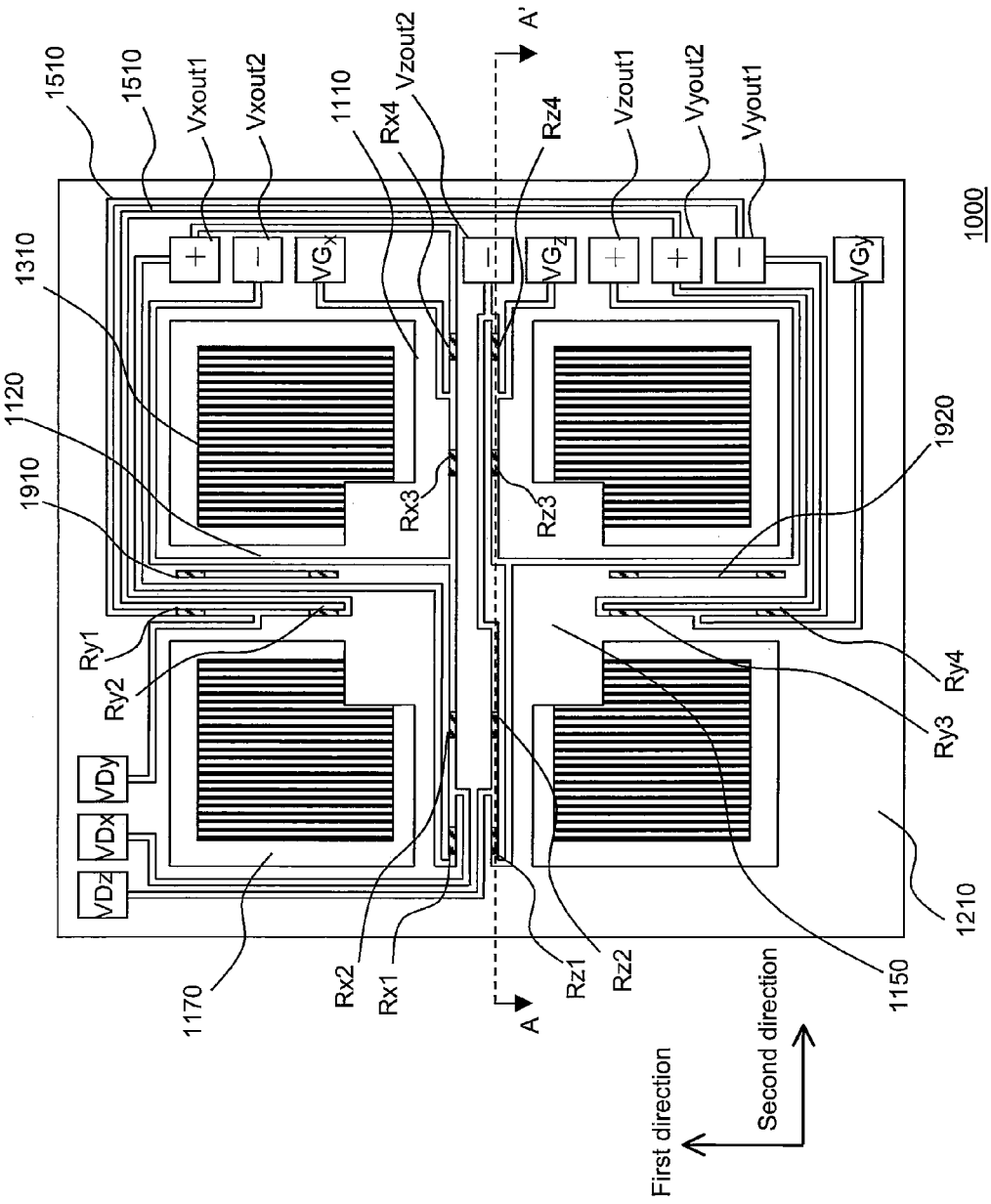
FIG. 9 is a schematic diagram of a semiconductor acceleration sensor 1000 of the present invention related to one embodiment.

FIG. 9 is a schematic diagram of a semiconductor acceleration sensor 1000 of the present invention related to one embodiment. The semiconductor acceleration sensor 1000 includes an X axis direction flexible part 1110, a Y axis direction flexible part 1120, an intersection part 1150 (spindle support part) between the X axis direction flexible part 1110 and the Y axis direction flexible part 1120, a frame part 1210 and a spindle part 1310. An aperture part 1170 is arranged adjacent to the spindle part 1310 and divides the spindle part 1310 and the frame part 1210.

In order to detect acceleration in the X axis direction, piezo resistor element Rx1, piezo resistor element Rx2, piezo resistor element Rx3 and piezo resistor element Rx4 are formed on the flexible part 1110 in the X axis direction, connected by a wire 1510 and a sensor circuit is formed which detects acceleration in the X axis direction. In addition, in order to detect acceleration in a Z axis direction, piezo resistor element Rz1, piezo resistor element Rz2, piezo resistor element Rz3 and piezo resistor element Rz4 are formed on the flexible part 1110 in the X axis direction, connected by a wire 1510 and a sensor circuit is formed which detects acceleration in the Z axis direction.

In order to detect acceleration in the Y axis direction, piezo resistor element Ry1, piezo resistor element Ry2, piezo resistor element Ry3 and piezo resistor element Ry4 are formed on the flexible part 1120 in the Y axis direction, connected by a wire 1510 and a sensor circuit is formed which detects acceleration in the Y axis direction. Furthermore, by arranging a dummy resistor element 1910 and dummy resistor element 1920 on the flexible part 1120 in the Y axis direction, it is possible to obtain a balance with the flexible part 1110 in the X axis direction.

The flexible part 1110 of the X axis direction and the flexible part 1120 of the Y axis direction are bent by forming the spindle part 1310 on the bottom side of the intersection part 1150 and shaking of the spindle part 1310 according to the acceleration. The semiconductor acceleration sensor 1000 can detect acceleration tri-axially by detecting this bending using the sensor circuit which detects acceleration in the X axis direction, the sensor circuit which detects acceleration in the Y axis direction and the sensor circuit which detects acceleration in the Z axis direction.

The flexible part 1110 of the X axis direction and the flexible part 1120 of the Y axis direction are supported by the frame part 1210 and power source input terminals VDx, VDy and VDz, low voltage side terminals VGx, VGy and VGz and output terminals Vxout1, Vxout2, Vyout1, Vyout2, Vzout1 and Vzout2 are arranged on the frame part 1210.

Furthermore, in the present embodiment an example is shown in which the semiconductor acceleration sensor 1000 includes the flexible part 1110 of the X axis direction and the flexible part 1120 of the Y axis direction. However, the semiconductor acceleration sensor 1000 may include a diaphragm shaped flexible part instead of a beam shaped flexible part. That is, the spindle part is supported by the diaphragm, and piezo resistor elements which detect acceleration in the X axis direction and the Y axis direction may be arranged in mutual intersecting axis directions on the upper part surface of the diaphragm. In addition, the semiconductor acceleration sensor 1000 is explained as a semiconductor acceleration sensor formed with piezo resistor elements, however, the semiconductor acceleration sensor may be formed with piezo elements and detect acceleration.

Figure 10:
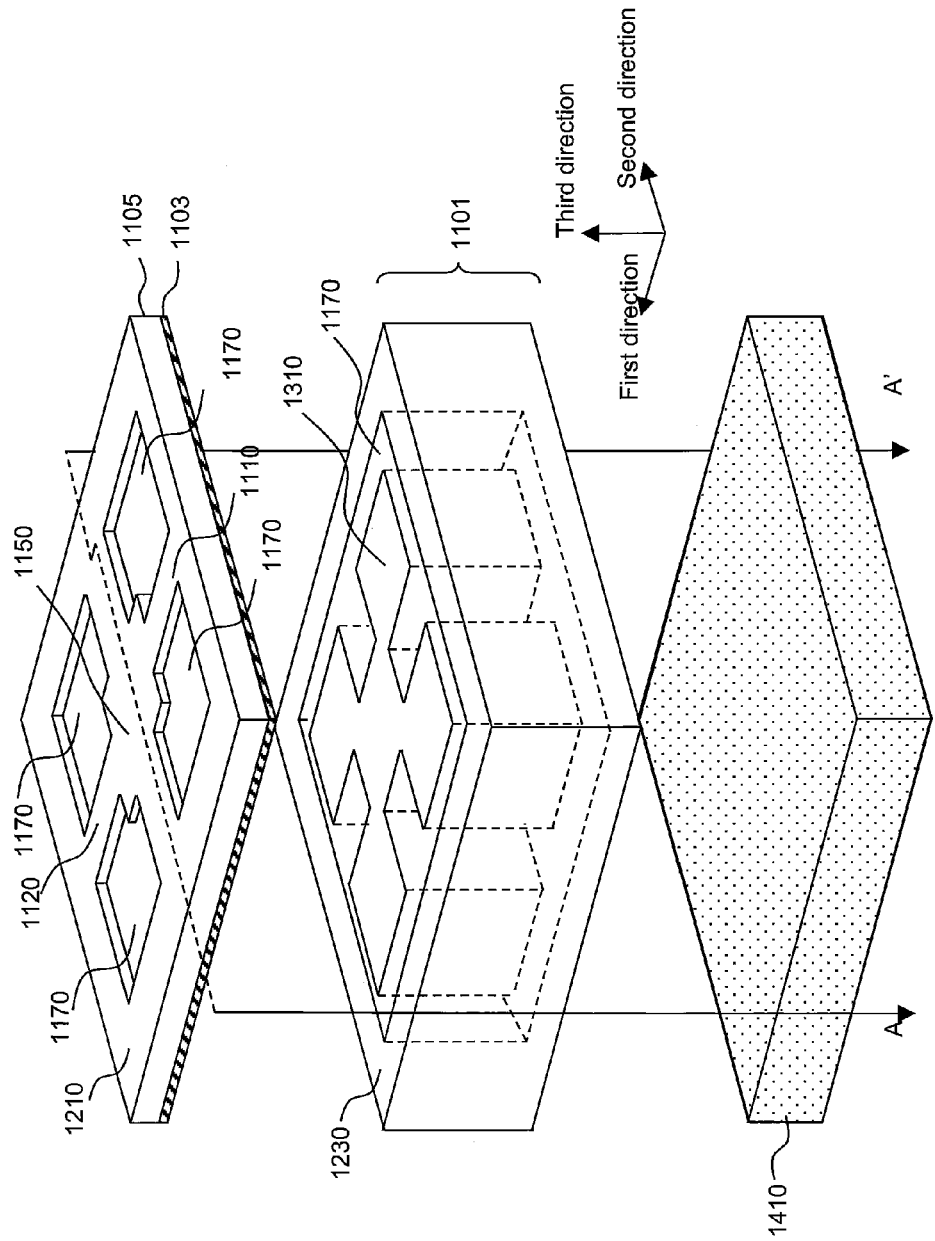
FIG. 10 is an exploded perspective view of the semiconductor acceleration sensor 1000 of the present invention related to one embodiment.

The manufacturing method of the semiconductor acceleration sensor related to the present embodiment is explained below. FIG. 10 is an exploded perspective view of the semiconductor acceleration sensor 1000. In addition, FIGS. 11A to 11E and FIGS. 12F to 12G are diagrams which explained the manufacturing processes of the semiconductor acceleration sensor 1000 using a cross sectional diagram along the cross section A-A' of FIG.9 and FIG.10.

Referring to FIG. 10, the semiconductor acceleration sensor 1000 which includes an acceleration sensor main part 1001 is formed using an SOI substrate stacked with a silicon oxide film 1103 formed on a silicon wafer 1101 and silicon films 1105 above this, and joined to a support substrate 1410. A frame part 1210, an X axis direction flexible part 1110, a Y axis direction flexible part 1120 and an intersection part 1150 between the X axis direction flexible part 1110 and the Y axis direction flexible part 1120 arranged on the interior of the frame part 1210, are formed on the silicon wafer 1105 and silicon oxide film 1103. In addition, an aperture part 1170 which is enclosed by the frame part 1210, the X axis direction flexible part 1110, the Y axis direction flexible part 1120 and the intersection part 1150, is formed on the silicon film 1105 and silicon oxide film 1103.

A frame part 1230 and a spindle part 1310 are formed on the silicon wafer 1101 and the spindle part 1310 is arranged separated from the interior wall of the frame part via aperture parts 1170 arranged adjacent to the spindle part 1310. The intersection part 1150 and the spindle part 1310 are joined via the silicon oxide film 1103. In the present embodiment, the spindle part 1310 has a clover shape, however, the shape of the spindle part 1310 is not limited to a clover shape.

For example, glass, metal, insulation resin or a Si semiconductor can be used as the support substrate 1410. A joining method can be appropriately selected from anodic bonding, direct bonding, eutectic bonding or adhesion using an adhesive. In addition, it is also possible to mount the sensor main part on a mounting substrate or packaging substrate directly without arranging the support substrate 1410.

Figure 11A:
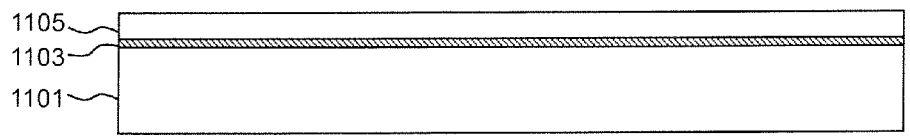
FIG. 11A is a diagram which explains a manufacturing process of the semiconductor acceleration sensor 1000 of the present invention related to one embodiment.

Next, the manufacturing processes of the semiconductor acceleration sensor 1000 are explained. The SOI substrate shown in FIG. 11A is manufactured by SIMOX or an affixing method etc. The silicon oxide film 1103 also functions as an etching stopper layer in a process described below. In the present embodiment, the piezo resistor elements Rx1-Rx4 and the piezo resistor elements Rz1-Rz4 are formed on the X axis direction flexible part 1110 and the piezo resistor elements Ry1-Ry4 are formed on the Y axis direction flexible part 1120.

Figure 11B:
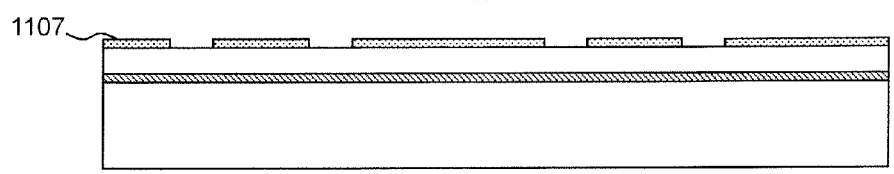
FIG. 11B is a diagram which explains a manufacturing process of the semiconductor acceleration sensor 1000 of the present invention related to one embodiment.

An impurity diffusion mask 1107 is formed on the silicon film 1105 side of the SOI substrate (FIG. 11B). In the present embodiment, as explained in the first to fourth embodiments, in a patterning formation process, a mask 1107 is formed by a pattern arrangement method in which the plane direction of a silicon wafer is confirmed and the angle of the arranged patterned is misaligned, a chip pattern is arranged in a checkered shape and the chip pattern is arranged by misaligning the pattern in sequence in an X axis direction and a Y axis direction.

It is possible to use a silicon nitride film ($Si_3N_4$), or a silicon oxide film ($SiO_2$) for example, as the mask 1107. After forming a silicon oxide film on the entire surface of the silicon film 1105 using a thermal oxidation method or plasma CVD method, a silicon nitride film is formed, a resist pattern (not shown in the diagram) is formed on the silicon nitride film, and piezo resistor elements and apertures corresponding to the piezo resistor elements are formed on the silicon nitride film and silicon oxide film using RIE (Reactive Ion Etching) or wet etching.

Figure 11C:
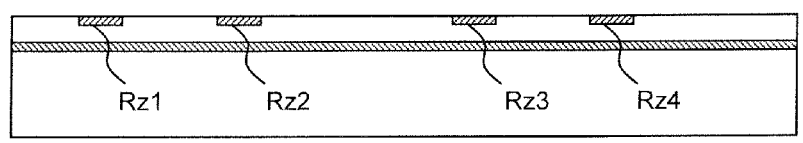
FIG. 11C is a diagram which explains a manufacturing process of the semiconductor acceleration sensor 1000 of the present invention related to one embodiment.

Each piezo resistor element is formed by a thermal diffusion method or ion injection method (FIG. 11C). For example, in the case where boron is diffused into the silicon film 1105 using the diffusion method, $BBr_3$ is exposed to at least the surface on which the mask 1107 is formed, impurities are deposited and an impurity diffusion layer is formed.

Figure 11D:
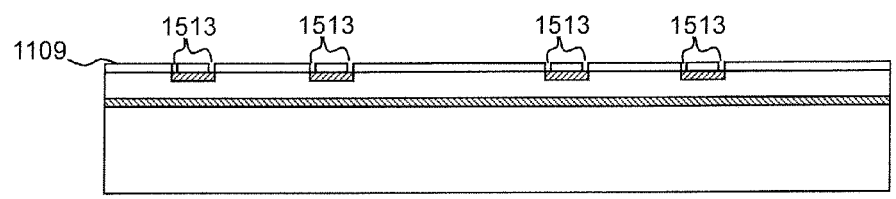
FIG. 11D is a diagram which explains a manufacturing process of the semiconductor acceleration sensor 1000 of the present invention related to one embodiment.

Next, an insulation layer 1109 is formed on the silicon film 1105 (FIG. 11D). For example, a $SiO_2$ insulation layer is formed on the surface of the silicon film 1105 using a thermal oxidation method or plasma CVD method. A contact hole 1513 is formed by RIE on the insulation layer 1109 using the resist as a mask.

Figure 11E:
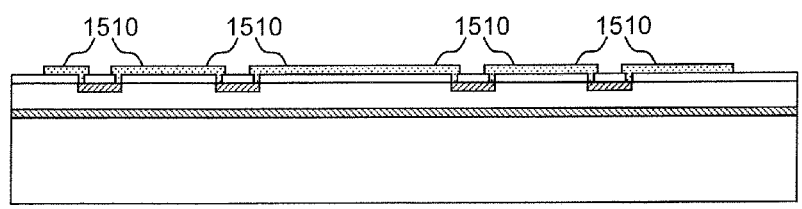
FIG. 11E is a diagram which explains a manufacturing process of the semiconductor acceleration sensor 1000 of the present invention related to one embodiment.

Next, wires 1510 for connecting to the piezo resistor elements via the contact hole 1513 are formed (FIG. 11E). The wires 1150 are formed by a sputter method etc using a metal material such as Al, Al—Si, Al—Nd, and patterned. Furthermore, a heat treatment process (380° C.-420° C.) is preferred in order to form an ohmic contact between the wires 1150 and piezo resistor elements. Furthermore, a protection film may also be formed on the wires 1510. Power source input terminals VDx, VDy and VDz, ground terminals VGx, VGy, and VGz, output terminals Vxout1, Vxout2, Vyout1, Vyout2, Vzout1 and Vzout2, can be formed by the same process and the same material as the wires 1510.

Figure 12F:
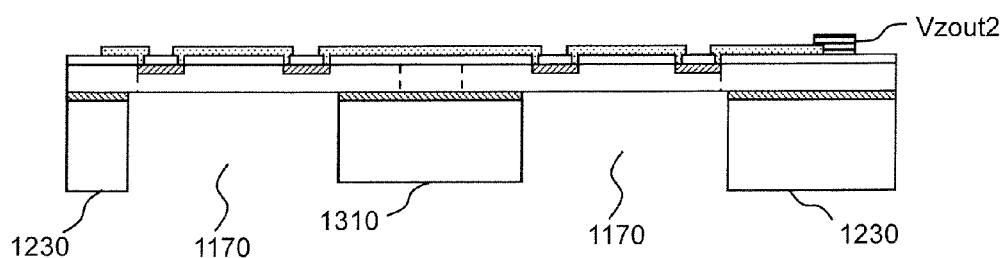
FIG. 12F is a diagram which explains a manufacturing process of the semiconductor acceleration sensor 1000 of the present invention related to one embodiment.

Following this, the silicon film 1105 is etched using RIE etc until the upper surface of the silicon oxide film 1103 is exposed, the aperture part 1170 is arranged and the frame part 1210, flexible part 1110 in the X axis direction, flexible part 1120 in the Y axis direction and the intersection part 1150 are formed (FIG. 12F). In addition, the aperture part 1170 is formed along the interior frame of the frame part 1230 using a mask in order to form a gap with a necessary interval for displacement downwards (support substrate 1410) of the spindle part 1310. The gap is approximately 5-10 μm in size for example.

Furthermore, a mask is formed on the bottom surface of the silicon wafer 1101 in order to form the frame part 1230 and the spindle part 1310. The silicon wafer 1101 is etched using this mask until the bottom surface of the silicon oxide film 1103 is exposed. DRIE (Deep Reactive Ion Etching) is used for the etching process.

Figure 13:
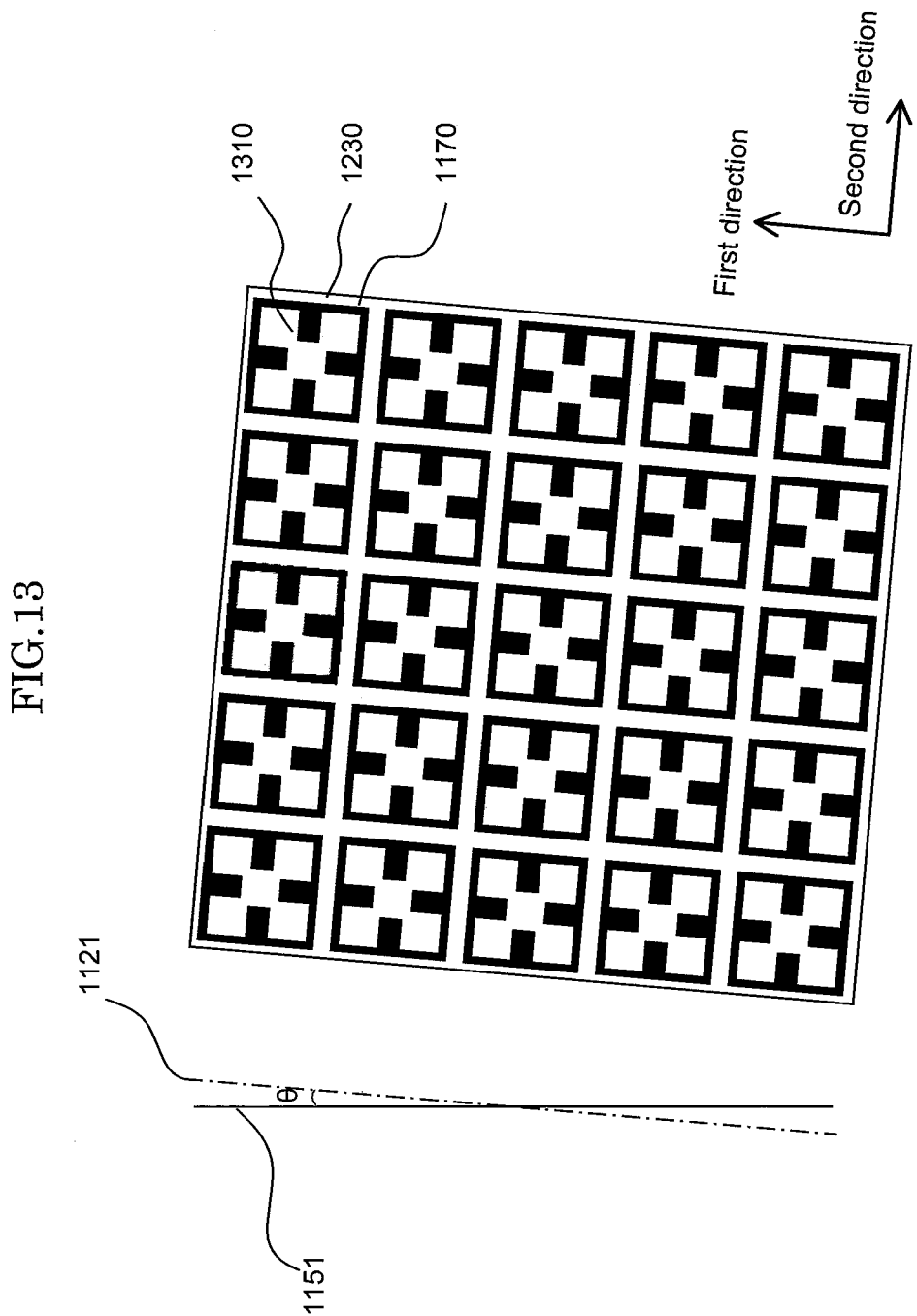
FIG. 13 is a diagram which shows the surface of an SOI substrate silicon wafer 1101 side formed with an aperture part 1170 applying the pattern arrangement method of the present invention related to one embodiment.

FIG. 13 is a diagram which shows the silicon wafer 1101 side of the SOI substrate formed with the aperture part 1170. In the manufacturing processes described above, a plurality of semiconductor acceleration sensors 1000 are formed on one SOI substrate. As a result, a plurality of spindle parts 1310 and frame parts 1230 are regularly formed on the silicon wafer 1101 and a plurality of aperture parts 1170 are regularly arranged. As explained in the first to fourth embodiments, in the case where the aperture part 1170 is arranged parallel to the first direction and the second direction, a pattern is formed in which the line 1121 which virtually links intermittently arranged aperture parts 1170 as a straight line in the first direction, and the axis 1151 in which the cleavage plane of the silicon wafer and the surface arranged with a pattern on the silicon wafer intersect, are misaligned. The arrangement method of the aperture parts 1170 is not limited to this pattern, the method explained in the second to fourth embodiments may also be used.

Following this, the unnecessary parts of the of silicon oxide film 1103 used as an etching stopper are removed by RIE or wet etching. In this way, the silicon oxide film 1103 only remains between the frame part 1210 and the frame part 1230, and between the intersection part 1150 and the spindle part 1310 (FIG. 12F). The sensor main body 1001 is manufactured by the above described processes.

Figure 12G:
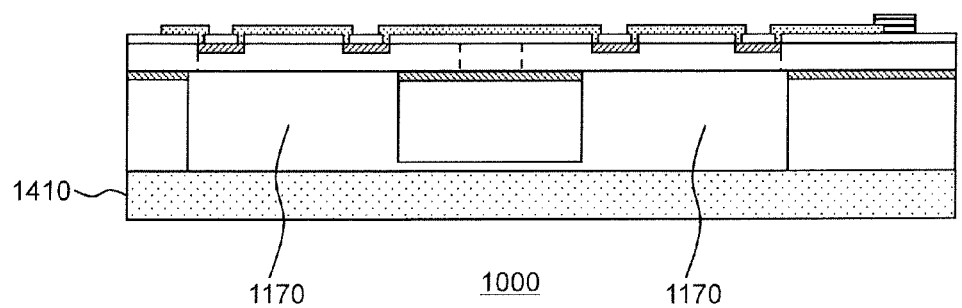
FIG. 12G is a diagram which explains a manufacturing process of the semiconductor acceleration sensor 1000 of the present invention related to one embodiment.

Lastly, the sensor main body 1001 and the support substrate 1410 are joined together (FIG. 12G). The support substrate 1410 and the sensor main body 1001 are joined using direct bonding or adhesion using an adhesive. In this way, the sensor main body 1001 and the support substrate 1410 are joined together and the semiconductor acceleration sensor 1000 is formed. Following this, the silicon wafer is diced and the acceleration sensor fragmented. The above is one example of a manufacturing method of an acceleration sensor and the sequence of processes can be appropriately changed.

As described above, in the manufacturing process of the semiconductor acceleration sensor which is formed by deep etching the silicon wafer, in the conventional pattern arrangement method which matches a plane direction, when the line which virtually links the pattern arranged intermittently as a straight line and the cleavage plane of the plane direction <110> matches, the semiconductor acceleration sensors easily fracture along this pattern. It is difficult for the semiconductor acceleration sensor to fracture by using the pattern arrangement method related to the present invention of the present embodiment, it is easy to handle and yield can be increased.

(Capacitance type semiconductor acceleration sensor)

Figure 14:
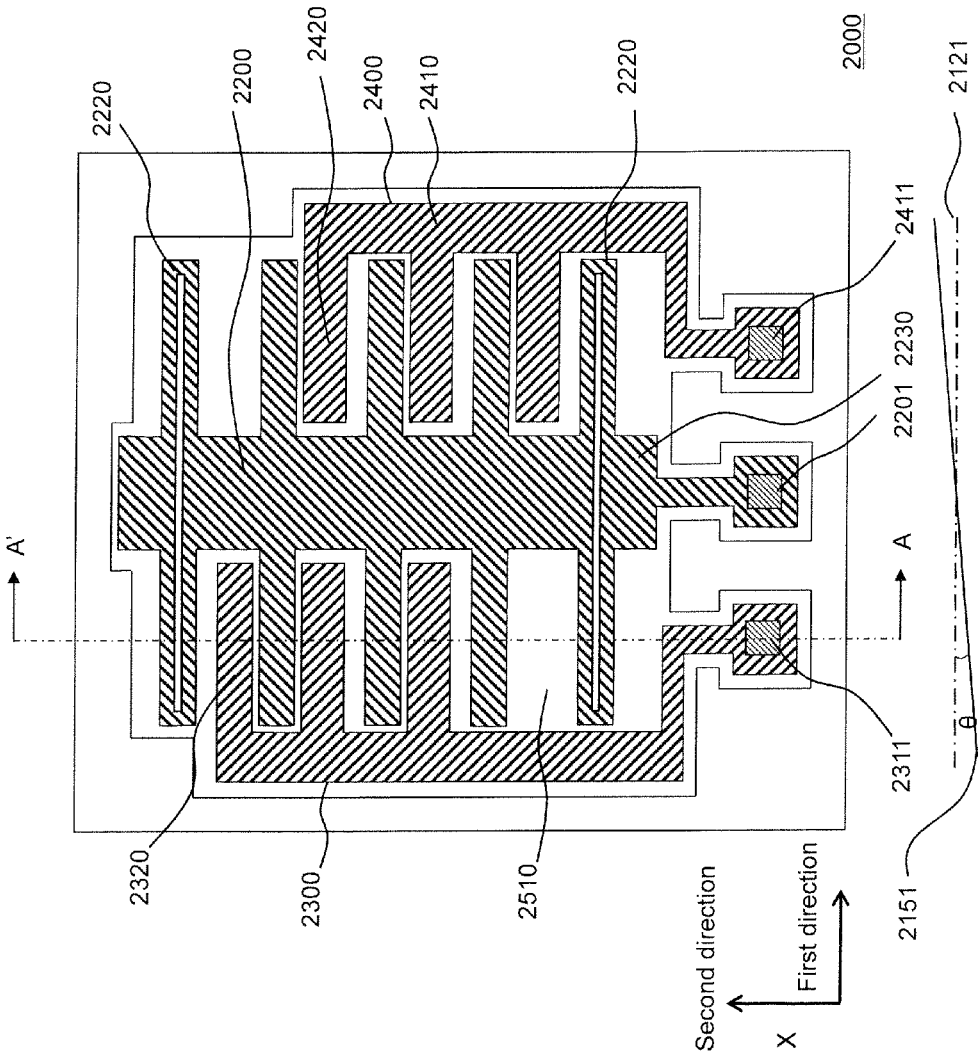
FIG. 14 is a schematic diagram of a semiconductor acceleration sensor 2000 which can be applied with the pattern arrangement method of the present invention related to one embodiment.
Figure 15:
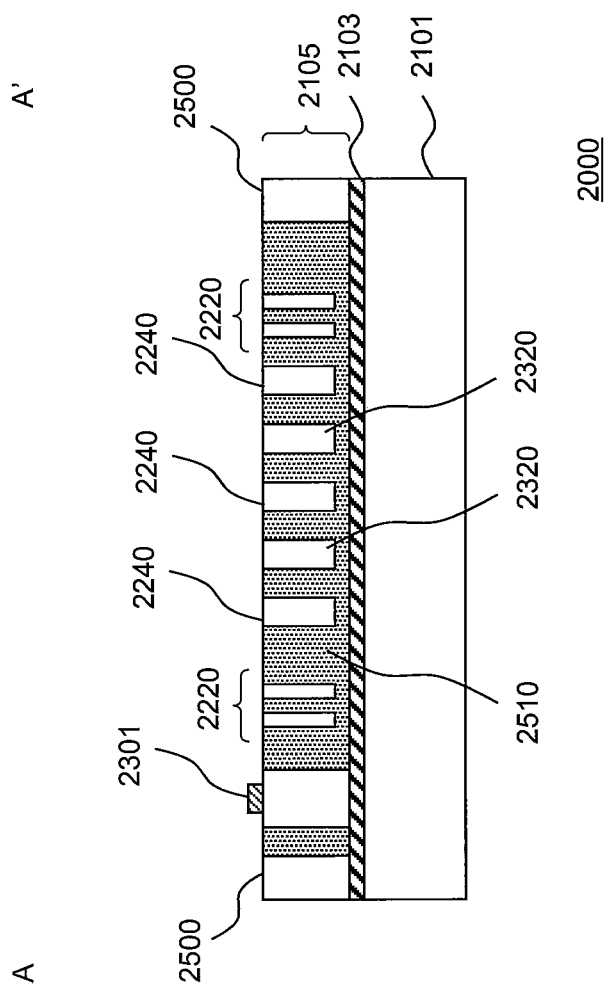
FIG. 15 is a cross sectional diagram of the semiconductor acceleration sensor 2000 in the cross section A-A' in FIG. 14.

In addition, the pattern arrangement method related to the present invention of the present embodiment demonstrate even better effects when manufacturing a capacitance type semiconductor acceleration sensor 2000 which includes the comb shaped electrode shown in FIG. 14. FIG. 15 is a cross sectional diagram along the cross section A-A' in FIG. 14. The semiconductor acceleration sensor 2000 is formed by arranging a first fixing part 2300 and a second fixing part 2400 on both sides of a movable part 2200 which is linked to a flexible part 2220 which is supported by a support part 2230. A movable electrode 2240 is formed on a movable part 2200 which is equivalent to the spindle part 1310 of the semiconductor acceleration sensor 1000, and a movable electrode terminal 2201 is arranged on the exterior side of the support part 2230. In addition, a first fixing electrode 2320 is formed on the first fixing part 2300 and connected to a fixing electrode terminal 2311 via a wiring part 2310. Similarly, a second fixing electrode 2420 is formed on the second fixing part 2400 and connected to a fixing electrode terminal 2411 via a wiring part 2410. Furthermore, an aperture part 2510 is arranged adjacent to the movable part 2200 and between the movable part 2200 and the first fixing part 2300, second fixing part 2400, and the movable part 2200 and the first fixing part 2300, second fixing part 2400 are separated and do not come into contact. In addition, a frame part 2500 is arranged on the exterior side of the movable part 2200, the first fixing part 2300 and the second fixing part 2400.

In the semiconductor acceleration sensor 2000, the movable electrode 2240 is displaced in the X direction in FIG. 14 according to the acceleration and by a change in the interval between the movable electrode 2240 and the fixing electrode 2320, the capacitance between both electrodes changes and acceleration is detected based on this capacitance change.

As is shown in FIG. 15 it is possible to manufacture the semiconductor acceleration sensor 2000 by forming a pattern on the SOI substrate in which a first silicon wafer 2101 and a second silicon wafer 2105 are affixed sandwiching the silicon oxide film 2103. In addition, it is possible to use one silicon wafer without using the SOI substrate. Because the semiconductor acceleration sensor 2000 is arranged with a straighter continuous structure than the semiconductor acceleration sensor 1000, the second silicon wafer 2105 fractures easily. Therefore, in the semiconductor acceleration sensor 2000 a plurality of aperture parts 2510 arranged parallel to the movable electrode 2240 and fixing electrode 2320 are arranged regularly on the second silicon wafer 2105. As explained in the first to fourth embodiments, in the case where the aperture parts 2510 are arranged parallel to the first direction and the second direction, a pattern is formed by misaligning the line 2121 which virtually links the aperture parts 2510 arranged intermittently as a straight line in the first direction, and the axis 2151 in which the cleavage plane of the silicon wafer and the surface arranged with a pattern on the silicon wafer. The arrangement method of the aperture parts 2510 is not limited to this, the method explained in the second to fourth embodiments may also be used.

Figure 16:
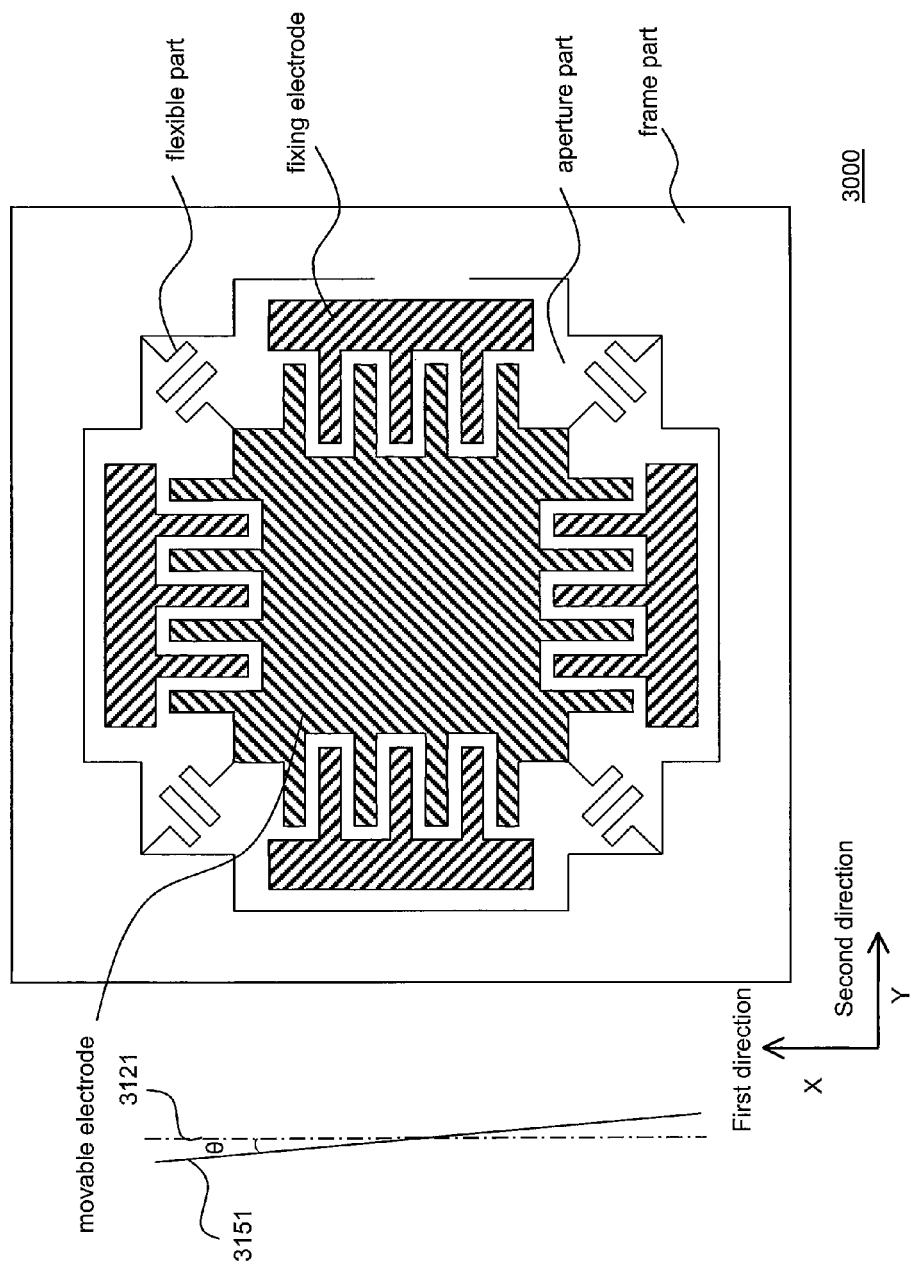
FIG. 16 is a schematic diagram of a biaxial capacitance type acceleration sensor 3000 which can be applied with the pattern arrangement method of the present invention related to one embodiment.

By using the pattern arrangement method related to the present invention of the present embodiment in the manufacture of the semiconductor acceleration sensor 2000 having this type of structure, it is possible to make the semiconductor acceleration sensor 2000 difficult to fracture, easy to handle and increase yield. In addition, similarly, the pattern arrangement method related to the present invention of the present embodiment is also effective in the manufacture of the biaxial capacitance type semiconductor acceleration sensor 3000 as is shown in FIG. 16. That is, a pattern is arranged by misaligning the virtual line 3121 whereby a plurality of aperture parts arranged parallel to the movable electrode and fixed electrode are arranged regularly, and the cleavage plane 3151 of the silicon wafer.

EXAMPLES

Figure 6:
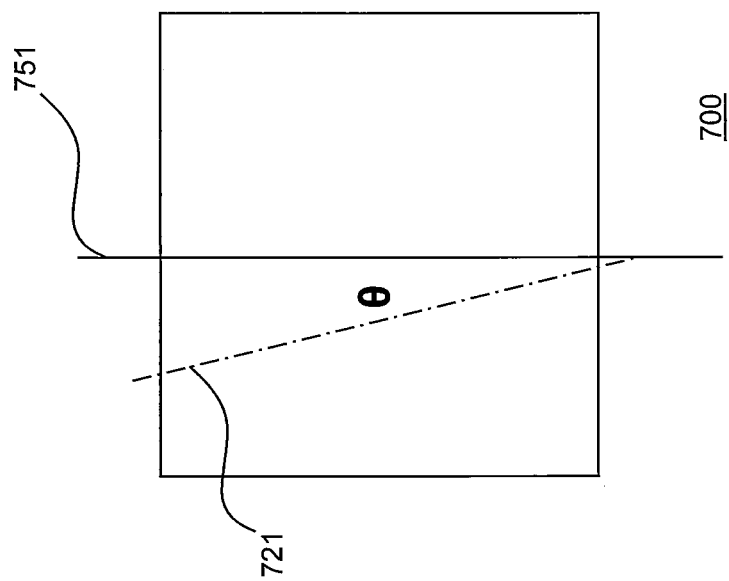
FIG. 6 is a schematic diagram which explains an experiment method of an example.

The effective range of the angle θ was examined in an embodiment in which the axis and the first direction are misaligned by an angle θ, explained in the first embodiment. FIG. 6 is a schematic diagram which explains an experimentation method of the examples. A plurality of groove patterns with a depth of 50 μm, width of 100 μm and length of 1 cm are arranged linearly and intermittently on the silicon wafer 700 using a 6 inch bare silicon wafer with a thickness of 625 μm. At this time, the pattern is arranged so that the line 721 which virtually links the pattern arranged intermittently as a straight line is misaligned by the angle θ with respect to the cleavage plane 751.

A plurality of silicon wafers 700 with various angles θ is created and each are made to fracture. In the case where a fracture occurs due to the cleavage, because the fractured surface of the silicon wafer matches the cleavage plane, the fractured surface become a cross section with few dents in which the crystals are removed. However, in the case where fracture does not occur due to the cleavage, because the fractured surface of the silicon wafer does not match the cleavage plane, the fractured surface becomes a cross section with many dents. A cross section of the silicon wafer 700 was observed using a scanning electron microscope (SEM) and evaluated for fractures caused by the cleavage plane.

Each of Figs. 7A-7E is an optical micrograph of a silicon wafer cross section in a silicon wafer fracture experiment in which a pattern is arranged at each angle. FIG. 7A is the fractured surface when the angle θ is 0°, FIG. 7B when the angle θ is 0.5°, FIG. 7C when the angle θ is 1.5°, FIG. 7D when the angle θ is 3° and FIG. 7E when the angle θ is 10°. The table 1 reflects the results, and marked as defective (X) when fractures occur due the cleavage, and good (O) when fractures do not occur due to the cleavage.

TABLE 1

| angle θ | 0° | 0.5° | 1.5° | 3° | 10° |
|---|---|---|---|---|---|
| result | x | x | x | o | o |

As is shown in Table 1, fractures do not occur due to the cleavage when the angle θ is 3° or higher. The silicon wafer includes axisymmetric crystallographic properties at an angle of 45°. Therefore, in the case of arranging a plurality of patterns linearly and intermittently on a silicon wafer, by misaligning the line which virtually links the patterns arranged intermittently in a range of 3° or more and 87° or less with respect to the axis of the cleavage plane, it is possible to provide a silicon wafer which is difficult to fracture.

In addition, according to one embodiment of the present invention, a pattern arrangement method is provided including using a stepper to arrange a plurality of chip patterns arranged parallel to a first direction and a second direction on a silicon wafer using a reticule which includes a plurality of patterns expanded in the first direction and the second direction which intersects the first direction and arranged linearly and intermittently, wherein the reticule or the silicon wafer is moved so that the plurality of chip patterns are misaligned in the second direction by a first distance.

In addition, according to one embodiment of the present invention, a semiconductor device is provided including a support part, a flexible part, one end of which is supported by the support part, a spindle part supported by the other end of the flexible part, a stress electrical conversion means which is positioned on the flexible part and detects by converting the displacement of the spindle part into an electric signal, and an aperture part arranged adjacent to the spindle part, wherein a plurality of patterns comprised from the aperture part is formed on a silicon wafer parallel to a first direction and a second direction which intersects the first direction, the plurality of patterns include one or more patterns arranged in a straight line in the first direction and the second direction, the plurality of patterns is arranged so that an axis in which a cleavage plane of the silicon wafer and a surface arranged with the pattern on the silicon wafer intersect, and the first direction are different.

In addition, according to one embodiment of the present invention, a semiconductor device is provided including a support part, a flexible part, one end of which is supported by the support part, a spindle part supported by the other end of the flexible part, a displacement detection means which detects displacement of the spindle part, and an aperture part arranged adjacent to the spindle part, wherein a plurality of patterns comprised from the aperture part is formed on a silicon wafer parallel to a first direction and a second direction which intersects the first direction, the plurality of patterns include one or more patterns arranged in a straight line in the first direction and the second direction, the plurality of patterns arranged parallel to the first direction are mutually different by a first distance in the second direction, and the plurality of patterns arranged in the second direction are different by a second distance in the first direction.

In addition, according to one embodiment of the present invention, a semiconductor device is provided including a support part, a flexible part, one end of which is supported by the support part, a spindle part supported by the other end of the flexible part, a stress electrical conversion means which is positioned on the flexible part and detects by converting the displacement of the spindle part into an electric signal, and an aperture part arranged adjacent to the spindle part, wherein a plurality of patterns comprised from the aperture part is formed on a silicon wafer parallel to a first direction and a second direction which intersects the first direction, the plurality of patterns include one or more patterns arranged in a straight line in the first direction and the second direction, the plurality of patterns arranged parallel to the first direction are mutually different by a first distance in the second direction, and the plurality of patterns arranged in the second direction are different by a second distance in the first direction.

An axis in which a cleavage plane of the silicon wafer and a surface on which the pattern of the silicon wafer is formed intersect, may match the first direction.

In addition, according to one embodiment of the present invention, a silicon wafer is provided including a plurality of patterns etched in a first direction and a second direction which intersects the first direction, and which is arranged intermittently in a straight line, and includes a plurality of chip patterns arranged parallel to the first direction and the second direction, wherein the plurality of chip patterns arranged parallel in the first direction are different by a first distance in the second direction and the plurality of chip patterns arranged parallel to the second direction are different by a second distance in the first direction.

An axis in which a cleavage plane of the silicon wafer and a surface on which the pattern of the silicon wafer is formed intersect, may match the first direction.

According to the present invention, a pattern arrangement method in which it is difficult to produce unintended fractures when forming the same pattern a plurality of times on a silicon wafer, a silicon wafer which is patterned using semiconductor lithography, and a semiconductor device which is produced by using the pattern arrangement method are provided.

The invention claimed is:

1. A pattern arrangement formed on a silicon wafer with a cleavage plane, comprising:
   a plurality of semiconductor devices each comprising:
      a support part;
      a flexible part, one end of which is supported by the support part;
      a spindle part supported by the other end of the flexible part;
      a displacement detection means positioned on the flexible part; which detects displacement of the spindle part; and
      an aperture part arranged adjacent to the spindle part, wherein the support part and/or the flexible part is formed by arranging the aperture part in; the silicon wafer,
   wherein said plurality of semiconductor devices are formed on the silicon wafer with the aperture parts arranged in a pattern that includes a straight line parallel to a first direction and a straight line parallel to a second direction which intersects the first direction; and
   wherein the pattern arrangement of the semiconductor devices is arranged so that an axis of the cleavage plane of the silicon wafer is misaligned with the first direction of the pattern at least partly with respect to the entire silicon wafer.

2. The pattern arrangement according to claim 1, wherein the displacement detection means is a stress electrical conversion means and detects by converting displacement of the spindle part into an electric signal.

3. The pattern arrangement according to claim 2, wherein the stress electrical conversion means is a stress electrical conversion element and the stress electrical conversion element is selected from a piezoresistance element and a piezoelectric element.

4. The pattern arrangement according to claim 1, wherein the displacement detection means includes a fixed electrode and a movable electrode, and detects displacement of the spindle part as a capacitance change between the fixed electrode and the movable electrode.

5. The pattern arrangement according to claim 1, wherein the aperture part of each semiconductor device is formed by etching the silicon wafer.

6. The pattern arrangement according to claim 1, wherein the displacement detection means forms a circuit which detects an external force.

7. The pattern arrangement according to claim 1, wherein the plurality of patterns is arranged so that an angle between the axis and the first direction becomes a first angle.

8. The pattern arrangement according to claim 1, wherein the angle between the axis and the first direction of one part of the plurality of patterns is 90 degrees.

* * * * *